United States Patent [19]
Leupold et al.

[11] Patent Number: 4,994,777
[45] Date of Patent: Feb. 19, 1991

[54] ENHANCED MAGNETIC FIELD WITHIN ENCLOSED CYLINDRICAL CAVITY

[75] Inventors: Herbert A. Leupold, Eatontown; Ernest Potenziani, II, Ocean, both of N.J.

[73] Assignee: The United States of America as represented by the Secretary of the Army, Washington, D.C.

[21] Appl. No.: 436,503

[22] Filed: Nov. 14, 1989

[51] Int. Cl.[5] .......... H01F 7/02; H01F 3/10; G01R 33/38

[52] U.S. Cl. .......... 335/302; 335/296; 335/306; 324/319

[58] Field of Search .......... 335/302, 304, 306; 315/5.24, 5.34, 5.35; 324/319, 320

[56] References Cited

U.S. PATENT DOCUMENTS

| | | | |
|---|---|---|---|
| 4,639,672 | 1/1987 | Beaumont | 324/319 |
| 4,672,346 | 6/1987 | Miyamoto et al. | 335/296 |
| 4,720,692 | 1/1988 | Jin | 335/306 |
| 4,758,813 | 7/1988 | Holsinger et al. | 335/306 |

FOREIGN PATENT DOCUMENTS

| | | | |
|---|---|---|---|
| 0274305 | 12/1986 | Japan | 335/209 |
| 0098602 | 5/1987 | Japan | 335/306 |
| 0222406 | 9/1988 | Japan | 335/302 |
| 8802923 | 4/1988 | World Int. Prop. O. | 335/302 |
| 8802925 | 4/1988 | World Int. Prop. O. | 335/302 |

*Primary Examiner*—Peter S. Wong
*Assistant Examiner*—Nilay H. Vyas
*Attorney, Agent, or Firm*—Michael Zelenka; John M. O'Meara

[57] ABSTRACT

The fabrication of a flux source using magnetically rigid material is disclosed for deriving a magnetic field of uniform density and enhanced magnitude within an enclosed cylindrical cavity thereof. In the preferred embodiments, segments of the magnetically rigid material are configured and arranged in the flux source to direct the magnetic field in parallel with the cyindrical axis of the cavity.

13 Claims, 1 Drawing Sheet

ENHANCED MAGNETIC FIELD WITHIN ENCLOSED CYLINDRICAL CAVITY

The invention described herein may be manufactured, used, and licensed by or for the United States Government for governmental purposes without the payment to us of any royalties thereon.

BACKGROUND OF THE INVENTION

The present invention relates generally to flux sources or permanent magnet structures wherein magnetically rigid (hereinafter MR) materials are utilized to sustain high magnitude magnetic fields of uniform flux density in enclosed cavities and more particularly, to such flux sources with cylindrical cavities.

In the electronic arts, magnetic fields are employed in various applications to control the dynamics of charged particles. One such application is electron beam focusing wherein the repelling forces between the beam's electrons is overcome with magnetic fields directed perpendicularly to the path travelled by the beam which is thereby precluded from spreading out. Another such application is found in radiation sources wherein magnetic fields are applied across the path travelled by charged particles to accelerate those particles thereacross in a perpendicular direction. Furthermore, very large magnetic fields are employed in NMR (Nuclear Magnetic Resonance) imagers which have become a very important tool in medical diagnostics.

Because of the massive solenoids and bulky power supplies which are associated therewith, electromagnets present problems in most applications where they are employed to sustain magetic fields. However, before MR material was used for permanent magnet structures, electromagnets were the generally accepted design approach for sustaining magnetic field magnitudes of any significance. Such was particularly true when a magnetic field confined within a work space or cavity was desired. This was so because suitable permanent magnet structures required exterior cladding magnets to confine the magnetic field, as well as bucking magnets and pole pieces to preclude flux leakage to the exterior of the structures and conventional magnets do not have sufficient coercivity to serve in these capacities.

SUMMARY OF THE INVENTION

It is the general object of the present invention to provide a flux source of MR material, with which a uniformly high magnetic field within a substantially cylindrical cavity is sustained.

It is a specific object of the present invention to accomplish the above-stated general object for a magnetic field directed parallel to the cylindrical axis of the cavity.

It is another specific object of the present invention to accomplish the above-stated objects with a flux source having a plurality of MR material layers nested therein to further enhance the magnetic field.

These and other objects are accomplished in accordance with the preferred embodiments of the present invention wherein at least one layer of MR material is utilized to construct the flux source thereof. In some preferred embodiments, circular segments of the MR material are arranged to construct a hollow cylinder and closures extending across both ends of the cylinder. Each preferred embodiment requires that the magnetic orientation of each segment be fixed in combination with the magnetic orientations of the other segments to direct the magnetic field in parallel with the cylindrical axis of the cavity. For still other preferred embodiments, segments having triangular cross-sections are utilized, and the magnetic orientation of each segment is established by the disposition thereof in its layer of MR material relative to the interior cavity or the exterior of the flux source.

In recent years cylindrical magnetic structures of various polygonal cross-sections have been designed to produce strong transverse fields in their internal cavities without flux leakage to the exterior of the structure. Of these the square cross-section appears to be particularly convenient to work with and useful in a number of applications and it will be used as the example in the following description of the invention although the latter applies to any cross-section.

If an infinitesimally thin section of the square structure is rotated about the central axis that extends in the direction of its magnetic field, the structure of FIGS. 1 and 2 results. This structure results in a uniform magnetic field in the cylindrical cavity that is parallel to the rotational axis. The field is now obtained in a finite structure in contrast to that in the infinitely long cylindrical structure from which the generating slice of the present structure was derived. Further, depending on the cross-section used as a generator, the field of the final structure is about one third greater than in the parent structure. A disadvantage of the resulting configuration is that it no longer affords complete flux confinement but generates a small residual dipolar field exterior to it. Usually this field is too small to be troublesome but can be eliminated by enclosure of the structure in a uniformly magnetized spherical shell which is of size and orientation just sufficient to cancel the exterior field without altering the field of interest in the interior of the cylinder cavity.

The scope of the present invention is only limited by the appended claims for which support is predicated on the preferred embodiments hereinafter set forth in the following description and the attached drawings wherein like reference characters relate to like parts throughout the several figures.

DESCRIPTION OF THE PREFERRED EMBODIMENTS

Figure 1:
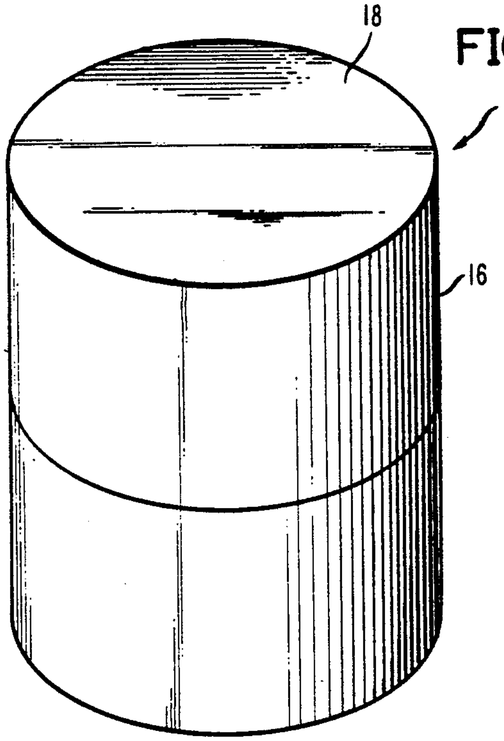
FIG. 1 is an isometric view along the vertical axis of a flux source in accordance with the invention, showing one possible exterior configuration therefore.
Figure 2:
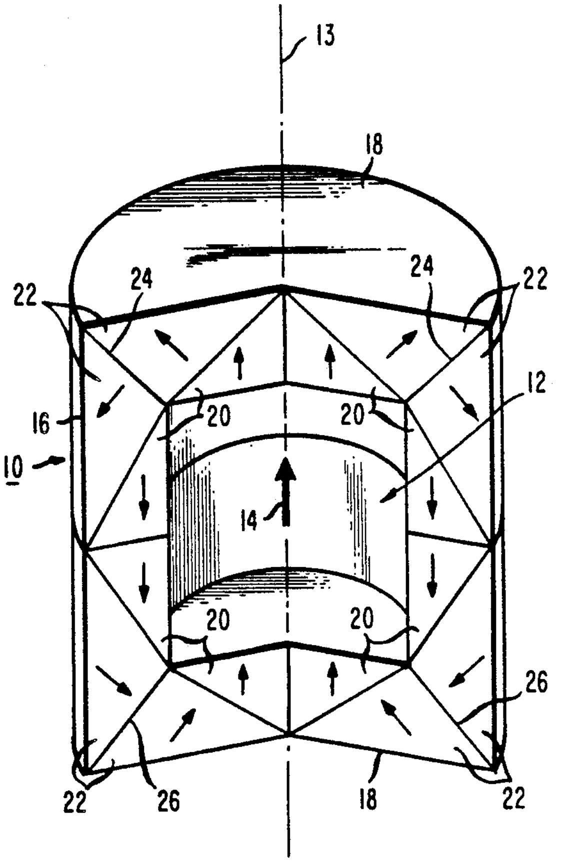
FIG. 2 is a cutaway view of the FIG. 1 flux source, showing the magnetic orientations of individual segments therein which are arranged to direct the magnetic field in parallel with the cylindrical axis of the cavity.
Figure 3:
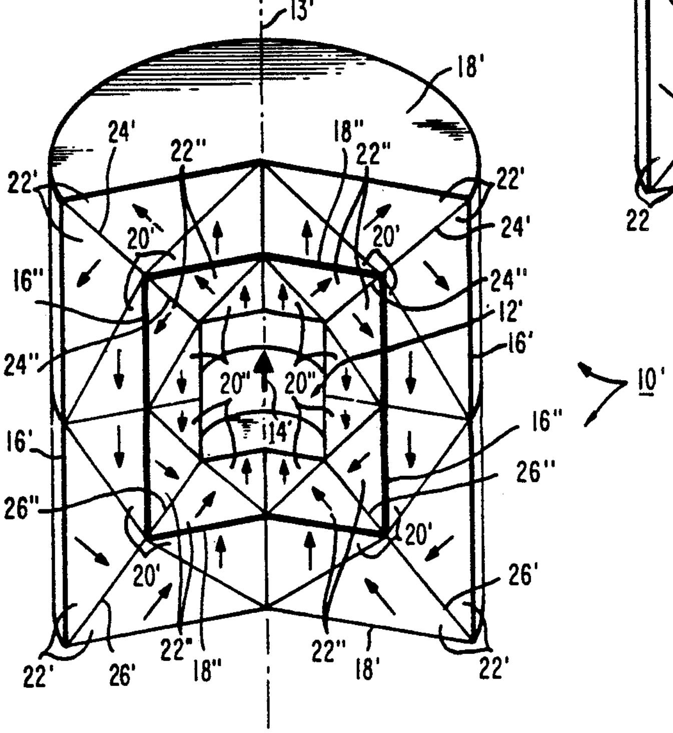
FIG. 3 is a cutaway view of the FIG. 1 flux source, which is similar to FIG. 2 but shows the individual segments arranged in a plurality of nested MR material layers.

A flux source or permanent magnet structure 10 in accordance with the preferred embodiments of the invention, is illustrated in FIG. 1. Within the flux source 10, an enclosed cavity 12 of substantially cylindrical configuration about an axis 13, is disposed as shown in FIGS. 2 and 3. MR material is utilized in the fabrication of the flux source 10 to sustain a magnetic field 14 of uniform density and enhanced magnitude in a direction parallel with the cylindrical axis 13 of the cavity 12, when the MR material is disposed and magnetized in accordance with the teaching of this invention.

As is apparent from U.S. Pat. No. 4,837,542 which issued on 6/6/89 to Herbert A. Leupold, a co-applicant hereto, and the publication of K. Halbach referenced in that patent, MR materials are well known to those skilled in the magnetic arts. Some ferrites, for example particular Barium Ferrites, and rare-earth alloys, for example Neodymium-Iron-Boron and Rare Earth Cobalts such as Samarium Cobalt or Cerium Cobalt, have been utilized or are being contemplated for use as MR materials. The most pronounced characteristic of MR materials is their very high coercivity (field magnitude required to demagnetize) relative to that of traditional magnetic materials. This characteristic may be viewed as the means that affords attainment of various magnetic circuit effects which render MR materials distinguishable from traditional magnetic materials, such as field transparency and flux path predictability or confinement. As to the former, external magnetic fields up to some magnitude greater than the remanence (magnetized level) of a MR material will pass therethrough without affecting the magnetic orientation thereof. A resultant field therefore occurs as the vector sum of the external field and the field sustained by the MR material. As to the latter, the magnitude and direction of the magnetization is constant throughout an single piece configuration of MR material, unless an extraordinary magnetizing apparatus and process are utilized therewith, such as disclosed and claimed in application Ser. No. 302,706 which was filed 1/26/89 by Herbert A. Leupold, the present applicant. Therefore, a field source can be constructed of magnetic segments fabricated from MR material, to configure a magnetic circuit as desired and even to completely contain a whole magnetic circuit by confining a magnet field to a cavity.

Although it is not yet practical to construct the flux source 10 with a single piece of MR material, a plurality of magnetized segments 20 and 22 (identifying numerals to be distinguished hereafter) can be arranged in at least one layer of MR material to construct a hollow cylinder 16 and closures 18 on both ends of the cylinder 16, as shown in FIG. 2. Each magnetized segment 20 and 22 is fabricated from MR material to have the magnetic orientation represented by the arrow shown therein. Such fabrication could be accomplished with the configuration of each segment 20 or 22 first being obtained by pressing the MR material and then magnetizing that segment 20 or 22 using any of the well know magnetization techniques. Of course, each segment 20 and 22 is magnetized in the direction of the arrow therein. Furthermore, even though the arrows of adjacent segments 20 and 22 are not in exactly the same direction the magnetic circuit passes between such segments substantially through only the interface therebetween, due to the flux confinement effect of the configuration. Consequently, the magnetic circuit does not leave the bounds of segments 20 and 22, except when it passes through the cavity 12 to develop the magnetic field 14 therein and unnecessary magnetic losses are thereby precluded.

Although magnetized segments having other exterior configurations could be utilized in various embodiments of the invention, only segments having substantially circular exterior configurations are disclosed herein. The magnetized segments 20 and 22 must be properly interfaced within the flux source 10 and to insure such interfacing, interfitting magnetized segments are utilized in the preferred embodiments of the invention. Magnetized segments 20 and 22 with substantially triangular crosssectional configurations can be precisely configured and easily arranged to provide such interfitting, as shown in FIGS. 2 and 3. Furthermore, the triangular cross-sectional configuration generally facilitates the fabrication of the magnetized segments, while precise dimensions for such magnetized segments are readily discernible.

Those skilled in the magnetic arts will certainly understand without any further explanation herein, that within the scope of this invention, each magnetized segment could be configured and disposed to partially define both the outer and inner bounds of its MR material layer. However, the magnetized segments 20 and 22 in the preferred embodiment of FIG. 2 are each disposed to bound its MR material layer either interiorly (segments 20) or exteriorly (segments 22). Of course, because the flux source 10 of FIG. 2 is constructed with only one layer of MR material, the interiorly disposed magnetized segments 20 also bound the cavity and the exteriorly disposed magnetized segments 22 also bound the flux source 10. The closures 18 for each layer are individually interfaced with the cylinder 16 for each layer, along separate boundaries 24 and 26 between at least one exteriorly disposed magnetized segment 22 in the closure 18 and at least one exteriorly disposed magnetized segment 22 in the cylinder 16. The magnetic orientation of each interiorly disposed magnetized segment 20 is aligned parallel to the magnetic field 14, with the magnetic orientations of the interiorly disposed magnetized segments 20 in the cylinder 16 of each layer being oppositely directed relative to the magnetic orientations of the interiorly disposed magnetized segments 20 in the closures 18 of each layer. Each exteriorly disposed magnetized segment 22 is interfaced with at least one other exteriorly disposed magnetized segment 22 along one of the boundaries 24 and 26, with its magnetic orientation aligned perpendicularly relative to the magnetic orientation of those other exteriorly disposed magnetized segments 22. The directions assigned to the magnetic orientations of the magnetized segments 20 and 22 in the cylinder 16 and closures 18 are of course determined in accordance with the desired direction the magnetic field 14 is to have along the cylindrical axis 13 of the cavity 12.

For the magnetic field 14 to be directed vertically up and in parallel with the cylindrical axis 13 of the cavity 12, the magnetic orientations of the magnetized segments 20 and 22 would be directed, as shown in FIG. 2. In the cylinder 16, the magnetic orientations of the interiorly disposed magnetized segments 20 would be directed at an angle of 180 degrees relative to the direction of the magnetic field 14, while the magnetic orientations of each exteriorly disposed magnetized segment 22 would generally be opposite in direction to the magnetic field 14 and perpendicular to the boundary 24 or 26 along which that segment interfaces with at least one exteriorly disposed magnetized segments 22 in the closure 18. As for the closures 18, the magnetic orientations of the interiorly disposed magnetized segments 20 would be directed at an angle of 0 degrees relative to the direction of the magnetic field 14, while the magnetic orientations of each exteriorly disposed magnetized segments 22 would generally be in the same direction as the magnetic field 14 and parallel to the boundary 24 or 26 along which that segment interfaces with at least one exteriorly disposed magnetized segments 22 in the cylinder 16.

Magnetized segments 20 and 22 having mirror image cross-sectional configurations and magnetic orientations are located on each side of the cavity's cylindrical axis 13 at symmetrically analogous locations in the flux source 10 of FIG. 2. Therefore, those segments 20 and 22 at the symmetrically analogous locations across the axis 13 may be consolidated into a single magnetized segment having a substantially circular configuration about axis 13 throughout 360 degrees, to facilitate the fabrication thereof.

As shown for the flux source 10' in FIG. 3, the MR material can be disposed in a plurality of layers to further enhance the magnitude of the magnetic field 14' within the cylindrical cavity 12' thereof. Of course, each MR material layer is constructed from a plurality of magnetized segments 20', 22' and 20", 22" respectively, which for the sake of discussion only are configured and arranged in the same manner as discussed above regarding FIG. 2. Consequently, the layers include cylinders 16' and 16" respectively, as well as closures 18' and 18" respectively, on each of cylinders 16' and 16". The inner layer is "nested" within the outer layer so that the outer dimensions of the inner layer are substantially equal to the inner dimensions of the outer layer and heavy lines are utilized to illustrate this in FIG. 3. Furthermore, when all of the analogous dimensions for the adjacent layers are in the same proportion, each layer contributes equally to the magnitude of the magnetic field 14' within the cavity 12'. The individual contributions of the layers add vectorially to produce the magnetic field 14' in a direction parallel with the cylindrical axis 13' of the cavity 12'. To optimize the uniformity and maximize the resulting vector magnitude of the magnetic field 14', cylinder 16' and 16" are coaxially aligned about the axis 13', while the closures 18' and 18" are arranged in parallel and aligned perpendicularly across the axis 13'. Certainly, it will be understood without further explanation herein that the magnetic orientations of the magnetized segments 20', 22' and 20", 22" respectively in each MR material layer would also be determined in accordance with the desired direction the magnetic field 14' is to have along the cylindrical axis 13' of the cavity 12', as explained previously relative to FIG. 2.

Those skilled in the art will appreciate without any further explanation that within the flux source construction concept of this invention, many modifications and variations are possible to the above disclosed embodiments. Consequently, it should be understood that all such modifications and variations fall within the scope of the following claims.

What we claim is:

1. In a flux source of the type having an enclosed cylindrical cavity wherein a magnetic field of uniform density and enhanced magnitude is sustained in a direction parallel with the cylindrical axis of said cavity, the improvement comprising:

said flux source being fabricated of magnetically rigid material disposed in a plurality of nested layers, each said layer including a plurality of interfitting magnetized segments, said segments being configured and arranged in each said layer to construct a hollow cylinder and closures on both ends thereof with each said segment being substantially triangular in cross-sectional configuration.

2. The flux source of claim 1 wherein each said magnetized segment is disposed to bound its magnetically rigid material layer either interiorly or exteriorly thereof.

3. In a flux source of the type having an enclosed cylindrical cavity wherein a magnetic field of uniform density and enhanced magnitude is sustained in a direction parallel with the cylindrical axis of said cavity, the improvement comprising:

said flux source including a plurality of interfitting magnetized segments fabricated of magnetically rigid material, said segments being configured and arranged to construct a hollow cylinder and closures on both ends thereof with each said segment being substantially triangular in cross-sectional configuration.

4. The flux source of claim 3 wherein the configuration of each said magnetized segment is substantially circular.

5. The flux source of claim 3 wherein each said magnetized segment is disposed in said flux source either interiorly to bound said cavity or exteriorly to bound said flux source.

6. In a flux source of the type having an enclosed cylindrical cavity wherein a magnetic field of uniform density and enhanced magnitude is sustained in a direction parallel with the cylindrical axis of said density, the improvement comprising:

said flux source including a plurality of magnetized segments fabricated of magnetically rigid material, said segments being configured and arranged to construct a hollow cylinder and closures on both ends thereof, each said segment being disposed either interiorly to bound said cavity or exteriorly to bound said flux source and each said closure being interfaced with said cylinder along a boundary between at least one said exteriorly disposed segments in said closure and at least one said exteriorly disposed segments in said cylinder.

7. The flux source of claim 6 wherein the magnetic orientations of said interiorly disposed magnetized segments are aligned parallel to said magnetic field with those in said cylinder being oppositely directed relative to those in said closures, each said exteriorly disposed magnetized segment being interfaced with at least one other exteriorly disposed magnetized segments along one of said boundaries and having its magnetic orientation aligned perpendicularly relative to the magnetic orientation of those other said exteriorly disposed magnetized segments, and the directions of the magnetic orientations for said magnetized segments in said cylinder and said closures are determined in accordance with the desired direction said magnetic field is to have along the cylindrical axis of said cavity.

8. The flux source of claim 6 wherein the configuration of each said magnetized segment is substantially circular.

9. The flux source of claim 6 wherein said magnetized segments are further configured and arranged to be interfitting.

10. In a flux source of the type having an enclosed cylindrical cavity wherein a magnetic field of uniform density and enhanced magnitude is sustained in a direction parallel with the cylindrical axis of said cavity, the improvement comprising:

said flux source being fabricated of magnetically rigid material disposed in a plurality of nested layers, each said layer including a plurality of magnetized segments, said segments being configured and arranged in each said layer to construct a hollow cylinder and closures on both ends thereof, each said segment being disposed to bound its layer either interiorly or exteriorly thereof, and each said layer is structured with its said closures being individually interfaced with its said cylinder along a boundary between at least one said exteriorly disposed segments in said closure and at least one said exteriorly disposed segments in said cylinder.

11. The flux source of claim 10 wherein each said layer has the magnetic orientations of its said interiorly disposed magnetized segments aligned parallel to said magnetic field with those in its said cylinder being oppositely directed relative to those in its said closures, while each of its said exteriorly disposed magnetized segments is interfaced with at least one other such exteriorly disposed magnetized segments along one of said boundaries with the magnetic orientations of such interfacing segments being aligned perpendicularly relative to each other, and the directions of the magnetic orientations for said magnetized segments in its said cylinder and said closures are determined in accordance with the desired direction said magnetic field is to have along the cylindrical axis of said cavity.

12. The flux source of claim 11 wherein each said layer has the magnetic orientations of said interiorly disposed magnetized segments in its said cylinder directed at an angle of 180 degrees relative to said magnetic field, the magnetic orientations of said interiorly disposed magnetized segments in its said closures directed at an angle of 0 degrees relative to said magnetic field, the magnetic orientation of each said exteriorly disposes magnetized segment in its said cylinder directed generally opposite to said magnetic field and perpendicular to said boundary along which that segment interfaces with said exteriorly disposed magnetized segments in said closures, and the magnetic orientation of each said exteriorly disposed magnetized segment in its said closures directed generally the same as said magnetic field and parallel to said boundary along which that segment interfaces with said exteriorly disposed magnetized segments in said cylinder.

13. The flux source of claim 8 wherein the magnetic orientations of said interiorly disposed magnetized segments in said cylinder are directed at an angle of 180 degrees relative to said magnetic field, the magnetic orientations of said interiorly disposed magnetized segments in said closures are directed at an angle of 0 degrees relative to said magnetic field, the magnetic orientation of each said exteriorly disposed magnetized segment in said cylinder is directed generally opposite to said magnetic field and perpendicular to said boundary along which that segment interfaces with said exteriorly disposed magnetized segments in said closures, and the magnetic orientation of each said exteriorly disposed magnetized segment in said closures is directed generally the same as said magnetic field and parallel to said boundary along which that segment interfaces with said exteriorly disposed magnetized segments in said cylinder.

* * * * *